United States Patent
Batzer et al.

(10) Patent No.: US 11,608,559 B2
(45) Date of Patent: *Mar. 21, 2023

(54) INTEGRATED SHOWERHEAD WITH THERMAL CONTROL FOR DELIVERING RADICAL AND PRECURSOR GAS TO A DOWNSTREAM CHAMBER TO ENABLE REMOTE PLASMA FILM DEPOSITION

(71) Applicant: Lam Research Corporation, Fremont, CA (US)

(72) Inventors: Rachel Batzer, Tualatin, OR (US); Huatan Qiu, Lake Oswego, OR (US); Bhadri Varadarajan, Beaverton, OR (US); Patrick Girard Breiling, Portland, OR (US); Bo Gong, Sherwood, OR (US); Will Schlosser, Portland, OR (US); Zhe Gui, Beaverton, OR (US); Taide Tan, Tigard, OR (US); Geoffrey Hohn, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/401,261

(22) Filed: Aug. 12, 2021

(65) Prior Publication Data
US 2021/0371982 A1    Dec. 2, 2021

Related U.S. Application Data

(63) Continuation of application No. 16/820,003, filed on Mar. 16, 2020, now Pat. No. 11,101,164, which is a
(Continued)

(51) Int. Cl.
*H01J 37/32* (2006.01)
*C23C 16/455* (2006.01)
(Continued)

(52) U.S. Cl.
CPC .. *C23C 16/45565* (2013.01); *C23C 16/45572* (2013.01); *C23C 16/505* (2013.01);
(Continued)

(58) Field of Classification Search
CPC . C23C 16/54; C23C 16/45551; C23C 16/545; C23C 16/4401; H01L 21/6719;
(Continued)

(56) References Cited

U.S. PATENT DOCUMENTS

| 5,597,439 A | 1/1997 | Salzman |
| 5,614,026 A | 3/1997 | Williams |

(Continued)

FOREIGN PATENT DOCUMENTS

| CN | 1574229 A | 2/2005 |
| CN | 101003895 A | 7/2007 |

(Continued)

OTHER PUBLICATIONS

Chinese First Office Action dated Apr. 10, 2018 issued in Application No. CN 201610361563.2.
(Continued)

*Primary Examiner* — Rudy Zervigon
(74) *Attorney, Agent, or Firm* — Weaver Austin Villeneuve & Sampson LLP

(57) ABSTRACT

A substrate processing system includes a first chamber including a substrate support. A showerhead is arranged above the first chamber and is configured to filter ions and deliver radicals from a plasma source to the first chamber. The showerhead includes a heat transfer fluid plenum, a secondary gas plenum including an inlet to receive secondary gas and a plurality of secondary gas injectors to inject the secondary gas into the first chamber, and a plurality of through holes passing through the showerhead. The through
(Continued)

holes are not in fluid communication with the heat transfer fluid plenum or the secondary gas plenum.

20 Claims, 10 Drawing Sheets

Related U.S. Application Data continuation of application No. 15/378,854, filed on Dec. 14, 2016, now Pat. No. 10,604,841.

(51) Int. Cl.
| | |
|---|---|
| *C23C 16/505* | (2006.01) |
| *H01L 21/67* | (2006.01) |
| *H01L 21/687* | (2006.01) |
| *B05C 13/02* | (2006.01) |
| *C23C 16/458* | (2006.01) |

(52) U.S. Cl.
CPC .... *H01J 37/3244* (2013.01); *H01J 37/32082* (2013.01); *H01J 37/32357* (2013.01); *H01J 37/32422* (2013.01); *H01J 37/32522* (2013.01); *H01J 37/32715* (2013.01); *H01L 21/67011* (2013.01); *H01L 21/67017* (2013.01); *H01L 21/67207* (2013.01); *H01L 21/68735* (2013.01); *H01L 21/68742* (2013.01); *H01L 21/68757* (2013.01); *H01L 21/68785* (2013.01); *B05C 13/02* (2013.01); *C23C 16/4581* (2013.01); *C23C 16/4583* (2013.01); *H01J 37/32642* (2013.01); *H01J 2237/334* (2013.01); *H01L 21/6715* (2013.01); *H01L 21/67069* (2013.01)

(58) Field of Classification Search
CPC ......... H01L 21/67196; H01L 21/67201; H01L 21/67173; H01L 21/67184; H01L 21/6776; H01L 21/67161; H01L 21/67155
USPC ................ 118/715, 723 E, 719; 156/345.43, 156/345.44, 345.45, 345.31, 345.32
See application file for complete search history.

(56) References Cited

U.S. PATENT DOCUMENTS

| | | |
|---|---|---|
| 5,871,586 A | 2/1999 | Crawley et al. |
| 5,919,382 A | 7/1999 | Qian et al. |
| 5,994,662 A | 11/1999 | Murugesh |
| 6,036,878 A | 3/2000 | Collins |
| 6,054,013 A | 4/2000 | Collins et al. |
| 6,059,885 A | 5/2000 | Ohashi et al. |
| 6,089,472 A | 7/2000 | Carter |
| 6,148,761 A | 11/2000 | Majewski et al. |
| 6,200,412 B1 | 3/2001 | Kilgore et al. |
| 6,205,869 B1 | 3/2001 | Schadt et al. |
| 6,251,188 B1 | 6/2001 | Hashimoto et al. |
| 6,291,793 B1 | 9/2001 | Qian et al. |
| 6,306,247 B1 | 10/2001 | Lin |
| 6,364,949 B1 | 4/2002 | Or et al. |
| 6,387,182 B1 | 5/2002 | Horie et al. |
| 6,387,207 B1 | 5/2002 | Janakiraman et al. |
| 6,444,039 B1 | 9/2002 | Nguyen |
| 6,537,419 B1 | 3/2003 | Kinnard |
| 6,565,661 B1 | 5/2003 | Nguyen |
| 6,616,767 B2 | 9/2003 | Zhao et al. |
| 6,635,117 B1 | 10/2003 | Kinnard et al. |
| 6,727,654 B2 | 4/2004 | Ogawa et al. |
| 6,782,843 B2 | 8/2004 | Kinnard et al. |
| 6,820,570 B2 | 11/2004 | Kilpela et al. |
| 6,921,437 B1 | 7/2005 | DeDontney et al. |
| 7,156,921 B2 | 1/2007 | Byun |
| 7,186,395 B2 | 3/2007 | Walsdorff et al. |
| 7,296,534 B2 | 11/2007 | Fink |
| 7,479,303 B2 | 1/2009 | Byun |
| 7,601,242 B2 | 10/2009 | Fink |
| 7,846,291 B2 | 12/2010 | Otsuki |
| 7,850,779 B2 | 12/2010 | Ma et al. |
| 7,931,749 B2 | 4/2011 | Amikura et al. |
| 7,976,631 B2 | 7/2011 | Burrows et al. |
| 8,057,600 B2 | 11/2011 | Nishimoto et al. |
| 8,083,853 B2 | 12/2011 | Choi et al. |
| 8,187,679 B2 | 5/2012 | Dickey et al. |
| 8,231,799 B2 | 7/2012 | Bera et al. |
| 8,298,370 B2 | 10/2012 | Byun |
| 8,308,865 B2 | 11/2012 | Kim et al. |
| 8,328,939 B2 | 12/2012 | Choi et al. |
| 8,361,275 B2 | 1/2013 | Tahara et al. |
| 8,361,892 B2 | 1/2013 | Tam et al. |
| 8,419,959 B2 | 4/2013 | Bettencourt et al. |
| 8,512,509 B2 | 8/2013 | Bera et al. |
| 8,562,785 B2 | 10/2013 | Kang et al. |
| 8,608,852 B2 | 12/2013 | Mahadeswaraswamy et al. |
| 8,679,956 B2 | 3/2014 | Tam et al. |
| 8,721,791 B2 | 5/2014 | Tiner et al. |
| 8,764,902 B2 | 7/2014 | Suzuki et al. |
| 8,869,742 B2 | 10/2014 | Dhindsa et al. |
| 8,882,913 B2 | 11/2014 | Byun et al. |
| 9,057,128 B2 | 6/2015 | Olgado |
| 9,315,897 B2 | 4/2016 | Byun et al. |
| 9,349,619 B2 | 5/2016 | Kawamata et al. |
| 9,441,791 B2 | 9/2016 | Mizusawa et al. |
| 9,447,499 B2 | 9/2016 | Roy et al. |
| 9,476,121 B2 | 10/2016 | Byun et al. |
| 9,677,176 B2 | 6/2017 | Chandrasekharan et al. |
| 10,023,959 B2 | 7/2018 | Sung et al. |
| 10,316,409 B2 | 6/2019 | Van Schravendijk |
| 10,494,717 B2 | 12/2019 | Sung et al. |
| 11,053,587 B2 | 7/2021 | Van Schravendijk |
| 2002/0017243 A1 | 2/2002 | Pyo |
| 2002/0179012 A1 | 12/2002 | Takatsu et al. |
| 2003/0010451 A1 | 1/2003 | Tzu et al. |
| 2003/0019580 A1 | 1/2003 | Strang |
| 2003/0051665 A1 | 3/2003 | Zhao et al. |
| 2003/0054099 A1 | 3/2003 | Jurgensen et al. |
| 2003/0077388 A1 | 4/2003 | Byun |
| 2003/0151114 A1 | 8/2003 | Zyl |
| 2003/0205328 A1 | 11/2003 | Kinnard et al. |
| 2004/0031565 A1 | 2/2004 | Su et al. |
| 2004/0050326 A1 | 3/2004 | Thilderkvist et al. |
| 2004/0082251 A1 | 4/2004 | Bach et al. |
| 2004/0216844 A1 | 11/2004 | Janakiraman et al. |
| 2004/0226507 A1 | 11/2004 | Carpenter et al. |
| 2005/0000430 A1 | 1/2005 | Jang et al. |
| 2005/0092248 A1 | 5/2005 | Lee et al. |
| 2005/0241579 A1 | 11/2005 | Kidd |
| 2005/0241763 A1 | 11/2005 | Huang et al. |
| 2005/0241765 A1 | 11/2005 | Dhindsa et al. |
| 2005/0241767 A1 | 11/2005 | Ferris et al. |
| 2006/0021703 A1 | 2/2006 | Umotoy et al. |
| 2006/0169201 A1 | 8/2006 | Hwang et al. |
| 2006/0191637 A1 | 8/2006 | Zajac et al. |
| 2006/0228496 A1 | 10/2006 | Choi et al. |
| 2006/0263522 A1 | 11/2006 | Byun |
| 2007/0068798 A1 | 3/2007 | Honda et al. |
| 2007/0089817 A1 | 4/2007 | Ganguli et al. |
| 2007/0110918 A1 | 5/2007 | Yuda et al. |
| 2007/0163440 A1 | 7/2007 | Kim et al. |
| 2007/0193515 A1 | 8/2007 | Jeon et al. |
| 2007/0215048 A1 | 9/2007 | Suzuki et al. |
| 2007/0264427 A1 | 11/2007 | Shinriki et al. |
| 2007/0272154 A1 | 11/2007 | Amikura et al. |
| 2008/0017315 A1 | 1/2008 | Fukuchi |
| 2008/0020146 A1 | 1/2008 | Choi et al. |
| 2008/0081124 A1 | 4/2008 | Sano et al. |
| 2008/0124463 A1 | 5/2008 | Bour et al. |
| 2008/0156264 A1 | 7/2008 | Fair et al. |
| 2008/0156631 A1 | 7/2008 | Fair et al. |
| 2009/0008034 A1 | 1/2009 | Tahara et al. |
| 2009/0095222 A1 | 4/2009 | Tam et al. |
| 2009/0095621 A1 | 4/2009 | Kao et al. |
| 2009/0098276 A1 | 4/2009 | Burrows et al. |

(56) References Cited

U.S. PATENT DOCUMENTS

| | | |
|---|---|---|
| 2009/0169744 A1 | 7/2009 | Byun et al. |
| 2009/0178615 A1 | 7/2009 | Kim et al. |
| 2009/0178616 A1 | 7/2009 | Byun |
| 2009/0202721 A1 | 8/2009 | Nogami et al. |
| 2009/0223449 A1 | 9/2009 | Ishida |
| 2009/0236313 A1 | 9/2009 | Qiu et al. |
| 2009/0266911 A1 | 10/2009 | Kim et al. |
| 2009/0320756 A1 | 12/2009 | Tanaka |
| 2010/0003405 A1 | 1/2010 | Kappeler |
| 2010/0003406 A1 | 1/2010 | Lam et al. |
| 2010/0048028 A1 | 2/2010 | Rasheed et al. |
| 2010/0184298 A1 | 7/2010 | Dhindsa |
| 2010/0261340 A1* | 10/2010 | Nijhawan ........... H01L 21/0262 257/E21.108 |
| 2010/0263588 A1 | 10/2010 | Zhiyin |
| 2010/0300359 A1 | 12/2010 | Armour et al. |
| 2011/0003087 A1 | 1/2011 | Soininen et al. |
| 2011/0023782 A1* | 2/2011 | Han .................. C23C 16/45565 118/724 |
| 2011/0039402 A1 | 2/2011 | Yamazaki et al. |
| 2011/0048325 A1 | 3/2011 | Choi et al. |
| 2011/0052833 A1 | 3/2011 | Hanawa et al. |
| 2011/0065276 A1 | 3/2011 | Ganguly et al. |
| 2011/0073038 A1 | 3/2011 | Chien et al. |
| 2011/0088847 A1 | 4/2011 | Law et al. |
| 2011/0097492 A1 | 4/2011 | Kerr et al. |
| 2011/0253044 A1 | 10/2011 | Tam et al. |
| 2011/0256315 A1 | 10/2011 | Tam et al. |
| 2011/0256692 A1 | 10/2011 | Tam et al. |
| 2011/0308551 A1 | 12/2011 | Chung et al. |
| 2012/0031559 A1 | 2/2012 | Dhindsa et al. |
| 2012/0052216 A1 | 3/2012 | Hanawa et al. |
| 2012/0067971 A1 | 3/2012 | Byun et al. |
| 2012/0135609 A1 | 5/2012 | Yudovsky et al. |
| 2012/0161405 A1 | 6/2012 | Mohn et al. |
| 2012/0225564 A1 | 9/2012 | Adachi et al. |
| 2012/0234945 A1 | 9/2012 | Olgado |
| 2012/0269968 A1 | 10/2012 | Rayner, Jr. |
| 2012/0321910 A1 | 12/2012 | Sneh |
| 2013/0052804 A1 | 2/2013 | Song |
| 2013/0093146 A1 | 4/2013 | Aihara et al. |
| 2013/0109159 A1 | 5/2013 | Carlson |
| 2013/0288485 A1 | 10/2013 | Liang et al. |
| 2013/0341433 A1 | 12/2013 | Roy et al. |
| 2014/0061324 A1 | 3/2014 | Mohn et al. |
| 2014/0103145 A1 | 4/2014 | White et al. |
| 2014/0127911 A1 | 5/2014 | Shih et al. |
| 2014/0179114 A1 | 6/2014 | van Schravendijk |
| 2014/0235069 A1* | 8/2014 | Breiling ............ C23C 16/45565 239/548 |
| 2014/0272185 A1 | 9/2014 | Na et al. |
| 2014/0299681 A1 | 10/2014 | Kashyap et al. |
| 2015/0004313 A1 | 1/2015 | Byun et al. |
| 2015/0007770 A1 | 1/2015 | Chandrasekharan et al. |
| 2015/0007771 A1 | 1/2015 | Silva et al. |
| 2015/0377481 A1 | 12/2015 | Smith et al. |
| 2015/0380221 A1 | 12/2015 | Liu et al. |
| 2016/0032453 A1 | 2/2016 | Qian et al. |
| 2016/0148789 A1 | 5/2016 | Chen et al. |
| 2016/0168705 A1 | 6/2016 | Lind |
| 2016/0340782 A1 | 11/2016 | Chandrasekharan et al. |
| 2016/0348242 A1 | 12/2016 | Sung et al. |
| 2018/0340256 A1 | 11/2018 | Sung et al. |
| 2019/0301013 A1 | 10/2019 | Van Schravendijk |

FOREIGN PATENT DOCUMENTS

| | | |
|---|---|---|
| CN | 101405433 A | 4/2009 |
| CN | 101423936 A | 5/2009 |
| CN | 101423937 A | 5/2009 |
| CN | 102424956 A | 4/2012 |
| CN | 102541102 A | 7/2012 |
| CN | 103403843 A | 11/2013 |
| CN | 103521956 A | 1/2014 |
| CN | 103890911 A | 6/2014 |
| CN | 103993293 A | 8/2014 |
| CN | 104278254 A | 1/2015 |
| CN | 104282530 A | 1/2015 |
| CN | 104342632 A | 2/2015 |
| CN | 106191814 B | 10/2018 |
| EP | 0709875 A1 | 5/1996 |
| EP | 0852392 A2 | 7/1998 |
| EP | 1496138 A1 | 1/2005 |
| EP | 1961837 A1 | 8/2008 |
| EP | 2187104 A1 | 5/2010 |
| JP | H05186292 A | 7/1993 |
| JP | H08239775 A | 9/1996 |
| JP | 2000144421 A | 5/2000 |
| JP | 2002030445 A | 1/2002 |
| JP | 2002033311 A | 1/2002 |
| JP | 2003533878 A | 11/2003 |
| JP | 2005303292 A | 10/2005 |
| JP | 2006261217 A | 9/2006 |
| JP | 2006322074 A | 11/2006 |
| JP | 2006324400 A | 11/2006 |
| JP | 2007142363 A | 6/2007 |
| JP | 2007191792 A | 8/2007 |
| JP | 2007227789 A | 9/2007 |
| JP | 2008066413 A | 3/2008 |
| JP | 2008211219 A | 9/2008 |
| JP | 2010062383 A | 3/2010 |
| JP | 201084190 A | 4/2010 |
| JP | 2010232402 A | 10/2010 |
| JP | 2012500471 A | 1/2012 |
| JP | 2012533890 A | 12/2012 |
| JP | 2014220231 A | 11/2014 |
| JP | 2016531436 A | 10/2016 |
| KR | 20040079559 A | 9/2004 |
| KR | 20040091218 A | 10/2004 |
| KR | 100687373 B1 | 2/2007 |
| KR | 20070118836 A | 12/2007 |
| KR | 20110036322 A | 4/2011 |
| KR | 20140000168 A | 1/2014 |
| KR | 20140103080 A | 8/2014 |
| KR | 20160133373 A | 11/2016 |
| TW | 490705 B | 6/2002 |
| TW | 492045 B | 6/2002 |
| TW | 200710928 A | 3/2007 |
| TW | 201229300 A | 7/2012 |
| TW | 201411761 A | 3/2014 |
| TW | 201502310 A | 1/2015 |
| TW | 201509537 A | 3/2015 |
| WO | WO-0129282 A2 | 4/2001 |
| WO | WO-0188962 A1 | 11/2001 |
| WO | WO-2009055244 A1 | 4/2009 |
| WO | WO-2011009002 A2 | 1/2011 |
| WO | WO-2011011532 A2 | 1/2011 |
| WO | WO-2011044451 A2 | 4/2011 |
| WO | WO-2012122054 A2 | 9/2012 |
| WO | WO-2012166362 A1 | 12/2012 |

OTHER PUBLICATIONS

Chinese First Office Action dated Dec. 9, 2015 issued in Application No. CN 20140052988.X.

Chinese First Office Action dated Mary 2, 2016 issued in Application No. CN 201410312720.1.

Chinese Fourth Office Action dated Sep. 13, 2017 issued in Application No. CN 201410052998.X.

Chinese Second Office Action dated Jul. 27, 2016 issued in Application No. CN 20140052988.X.

Chinese Third Office Action dated Mar. 2, 2017 issued in Application No. CN 201410052996.X.

International Search Report and Written Opinion Corresponding to Application No. PCT/US2018/064524 dated Apr. 1, 2019, 10 pages.

Japanese First Office Action dated Nov. 7, 2017 issued in Application No. JP 2014-021856.

Singapore Final Examination Report dated Jan. 12, 2016 issued in Application No. SG 201401171-2.

Singapore Search Report and Written Opinion dated Jul. 7, 2015 issued in Application No. SG 201401171-2.

(56) References Cited

OTHER PUBLICATIONS

Taiwan Examination and Search Report dated Apr. 11, 2017 issued in Application No. TW 102147584.
Taiwan Examination and Search Report dated May 12, 2017 issued in Application No. TW 103104956.
Taiwan Examination and Search Report dated Oct. 13, 2016 issued in Application No. TW 102122169.
U.S. Appl. No. 13/842,054, filed Mar. 15, 2013, entitled "Radical Source Design for Remote Plasma Atomic Layer Deposition."
U.S. Appl. No. 13/934,597, filed Jul. 3, 2013, entitled "Multi-Plenum, Dual-Temperature Showerhead."
U.S. Final Office Action dated May 18, 2016 issued in U.S. Appl. No. 13/842,054.
U.S. Final Office Action dated Sep. 16, 2016 issued in U.S. Appl. No. 13/934,597.
U.S. Notice of Allowance dated Apr. 14, 2017 issued in U.S. Appl. No. 13/934,597.
U.S. Notice of Allowance dated Jan. 10, 2017 issued in U.S. Appl. No. 13/934,597.
U.S. Notice of Allowance dated Jan. 15, 2016 issued in U.S. Appl. No. 13/531,254.
U.S. Notice of Allowance dated Mar. 8, 2018 issued in U.S. Appl. No. 15/163,594.
U.S. Notice of Allowance dated May 12, 2016 issued in U.S. Appl. No. 13/531,254.
U.S. Office Action dated Apr. 12, 2017 issued in U.S. Appl. No. 13/842,054.
U.S. Office Action dated Apr. 7, 2016 issued in U.S. Appl. No. 13/934,597.
U.S. Office Action dated Dec. 3, 2015 issued in U.S. Appl. No. 13/842,054.
U.S. Office Action dated Mar. 13, 2015 issued in U.S. Appl. No. 13/531,254.
U.S. Office Action dated Oct. 20, 2017 issued in U.S. Appl. No. 13/842,054.
U.S. Office Action dated Sep. 8, 2016 issued in U.S. Appl. No. 13/531,254.
U.S. Office Action dated Sep. 17, 2015 issued in U.S. Appl. No. 13/531,254.
Cao, et al., "Development of a scanning probe microscopy integrated atomic layer deposition system for in situ successive monitoring of thin film growth" Review of Scientific Instruments 89, 123702 (2018) pp. 1-8. https://doi.org/10.1063/1.5042463.
Chen, et al., "Advances in Remote Plasma Sources For Cleaning 300 mm and Flat Panel CVD Systems" Semiconductor Magazine, , Aug. 2003, pp. 1-6.
Chinese First Office Action dated Jun. 18, 2020 issued in Application No. CN 201811101686.8.
Chinese Second Office Action dated Feb. 22, 2021 issued in Application No. CN 201811101686.8.
Chinese Third Office Action dated Aug. 2, 2021 issued in Application No. CN 201811101686.8.
International Search Report and Written Opinion dated Apr. 9, 2018 issued in Application No. PCT/US2017/066411.
Japanese First Office Action dated Apr. 15, 2019 issued in Application No. JP 2018-087939.
Japanese First Office Action dated Feb. 13, 2018 issued in Application No. JP 2014-130967.
JP Office Action dated Dec. 21, 2021, in Application No. JP2019-531737 with English translation.
Korean Decision for Grant of Patent dated Jul. 29, 2020 issued in Application No. KR 10-2013-016139.
Korean First Office Action dated Aug. 28, 2019 issued in Application No. KR 10-2013-0071554.
Korean First Office Action dated Mar. 10, 2020 issued in Application No. KR 10-2013-0161939.
Korean First Office Action dated Nov. 18, 2020 issued in Application No. KR 10-2020-0142328.
KR Office Action dated Feb. 15, 2022, in Application No. KR10-2019-7018989 with English Translation.
Oviroh, Peter Ozaveshe, et al., "New development of atomic layer deposition: processes, methods and applications" Science and Technology of Advanced Materials (2019) vol. 20, No. 1, pp. 465-496. https://doi.org/10.1080/14686996.2019.1599694.
Paul, et al., "Anti reflection Coating on PM MA Substrates by Atomic Layer Deposition" Coatings 2020, 10, 64; pp. 1-13. doi: 10.3390/coatings 10010064Cpatomgs.
Taiwan First Office Action dated Jul. 3, 2018 issued in Application No. TW 107110096.
Taiwanese First Decision of Refusal dated Nov. 20, 2017 issued in Application No. TW 102147584.
Taiwanese First Office Action dated Aug. 7, 2019 issued in Application No. TW 105116200.
U.S. Advisory Action dated Oct. 2, 2019 in U.S. Appl. No. 15/378,854.
U.S. Advisory Action dated Dec. 6, 2018 issued in U.S. Appl. No. 13/934,620.
U.S. Final office Action dated Jul. 15, 2019 in U.S. Appl. No. 15/378,854.
U.S. Final Office Action dated Jun. 22, 2017 issued in U.S. Appl. No. 13/934,620.
U.S. Final office Action dated Oct. 31, 2019 in U.S. Appl. No. 15/378,854.
U.S. Final Office Action dated Sep. 13, 2018 issued in U.S. Appl. No. 13/934,620.
U.S. Non-Final office Action dated Mar. 5, 2019 in U.S. Appl. No. 15/378,854.
U.S. Notice of Allowance dated Nov. 20, 2019 in U.S. Appl. No. 15/378,854.
U.S. Notice of Allowance dated Apr. 15, 2021, in U.S. Appl. No. 16/820,003.
U.S. Notice of Allowance dated Feb. 11, 2019 issued in U.S. Appl. No. 13/842,054.
U.S. Notice of Allowance dated Jul. 30, 2019 issued in U.S. Appl. No. 16/035,491.
U.S. Notice of allowance dated Mar. 22, 2019 issued in U.S. Appl. No. 16/035,491.
U.S. Notice of Allowance dated Mar. 3, 2021 issued in U.S. Appl. No. 16/434,043.
U.S. Notice of Allowance dated Mar. 8, 2018 issued in U.S. Appl. No. 13/934,620.
U.S. Notice of Allowance dated May 30, 2018 issued in U.S. Appl. No. 13/842,054.
U.S. Office Action dated Nov. 20, 2017 issued in U.S. Appl. No. 13/934,620.
U.S. Office Action dated Nov. 28, 2018, issued in U.S. Appl. No. 16/035,491.
U.S. Office Action dated Oct. 12, 2016 issued in U.S. Appl. No. 13/934,620.
U.S. Restriction Requirement dated Dec. 11, 2018 in U.S. Appl. No. 15/378,854.
CN Office Action dated Nov. 25, 2022 in Application No. CN201780077684.7 with English translation.

* cited by examiner

INTEGRATED SHOWERHEAD WITH THERMAL CONTROL FOR DELIVERING RADICAL AND PRECURSOR GAS TO A DOWNSTREAM CHAMBER TO ENABLE REMOTE PLASMA FILM DEPOSITION

CROSS-REFERENCE TO RELATED APPLICATIONS

The present disclosure is a continuation of U.S. patent application Ser. No. 16/820,003, filed on Mar. 16, 2020 which is a continuation of U.S. patent application Ser. No. 15/378,854, filed on Dec. 14, 2016 (now U.S. Pat. No. 10,604,841, issued Mar. 31, 2020). The entire disclosures of the applications referenced above are incorporated herein by reference.

FIELD

The present disclosure relates to substrate processing systems, and more particularly to substrate processing systems including showerheads that deliver radicals and precursor gas to a downstream chamber.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to deposit film on a substrate such as a semiconductor wafer. The substrate processing systems typically include a processing chamber and a substrate support. During film deposition, radicals and precursor gas maybe supplied to the processing chamber.

For example, the processing chamber may include an upper chamber, a lower chamber and a substrate support. A showerhead may be arranged between the upper chamber and the lower chamber. The substrate is arranged on the substrate support in the lower chamber. A plasma gas mixture is supplied to the upper chamber and plasma is struck in the upper chamber. Some of the radicals generated by the plasma flow through the showerhead to the lower chamber. The showerhead filters ions and shields UV light from reaching the lower chamber. A precursor gas mixture is supplied to the lower chamber through the showerhead and reacts with the radicals to deposit film on the substrate.

Typically, the showerhead does not have a thermal control system. However, in some processing systems, a basic thermal control system is used to control a temperature of an outer edge of the showerhead, which is accessible and not under vacuum. The basic thermal control system does not uniformly control temperature across the showerhead due to the heat from the plasma. In other words, the temperature at the center of the showerhead increases. Temperature changes also occur with process changes such as plasma on/off, pressure, flow rate, and/or pedestal temperature. Variations in the temperature of the showerhead adversely impact the uniformity of the deposition process and defect performance.

SUMMARY

A substrate processing system includes a first chamber including a substrate support. A showerhead is arranged above the first chamber and is configured to filter ions and deliver radicals from a plasma source to the first chamber. The showerhead includes a heat transfer fluid plenum including an inlet to receive heat transfer fluid and a plurality of flow channels to direct the heat transfer fluid through a center portion of the showerhead to an outlet to control a temperature of the showerhead, a secondary gas plenum including an inlet to receive secondary gas and a plurality of secondary gas injectors to inject the secondary gas into the first chamber, and a plurality of through holes passing through the showerhead. The through holes are not in fluid communication with the heat transfer fluid plenum or the secondary gas plenum.

In other features, the heat transfer fluid plenum includes a first plenum in fluid communication with the inlet. The first ends of the flow channels are in communication with the first plenum. A second plenum is in fluid communication with opposite ends of the flow channels.

In other features, the heat transfer fluid plenum includes a first plenum in fluid communication with the inlet, a second plenum in fluid communication with first ends of the flow channels, a first plurality of restrictions arranged between the first plenum and the second plenum to restrict fluid flow therebetween, a third plenum in fluid communication with opposite ends of the flow channels, a fourth plenum in fluid communication with the outlet, and a second plurality of restrictions arranged between the third plenum and the fourth plenum to restrict fluid flow therebetween.

In other features, the plurality of flow channels flow in a radial direction from one side of the showerhead to an opposite side of the showerhead. The plurality of flow channels defines a straight path. The plurality of flow channels defines a curved path. The plurality of flow channels defines a sinusoidal-shaped path.

In other features, the secondary gas plenum includes a first plenum, a second plenum, and a flow restriction arranged between the first plenum and the second plenum.

In other features, the flow restriction comprises a first plurality of walls, and a plurality of slots defined between the first plurality of walls. The first plurality of walls is arcuate-shaped. A second plurality of walls is arranged around the through holes in the second plenum. The second plurality of walls is cylinder-shaped.

In other features, the secondary gas injectors are in fluid communication with the second plenum. A plurality of restrictions arranged between the second plenum and the secondary gas injectors.

In other features, the plurality of flow channels includes inlets and outlets. The inlets of the plurality of flow channels are arranged on one side of the showerhead, the outlets of the plurality of flow channels are arranged on the one side between the inlets, and the plurality of flow channels connect to the inlets, travel across the showerhead and return back across the showerhead to the outlets.

In other features, a second chamber is arranged above the first chamber. The showerhead is arranged between the first chamber and the second chamber. A coil is arranged around the second chamber. An RF generator is connected to the coil to generate plasma in the second chamber.

In other features, at least one of the flow channels includes a flow restriction. The heat transfer fluid comprises liquid. The heat transfer fluid comprises gas. The heat transfer fluid does not flow into the first chamber.

In other features, the secondary gas injectors extend a predetermined distance from a bottom surface of the showerhead, wherein the predetermined distance is in a range from 0.1" to 1.5". The through holes have a diameter in a range from 0.05" to 0.3".

In other features, the showerhead includes a cylindrical wall that extends from a bottom surface thereof and that is located radially outside of the plurality of through holes and the plurality of secondary gas injectors. The showerhead includes a cylindrical wall that extends upwardly from a top surface thereof and that is located radially outside of the plurality of through holes and the plurality of secondary gas injectors.

In other features, a first O-ring is arranged between a top surface of the showerhead and the upper chamber and a second O-ring is arranged between the bottom surface of the showerhead and the lower chamber.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

The present disclosure relates to a substrate processing system including an integrated, flush-mount showerhead that delivers uniform radicals and filters ions from a remote plasma source. The showerhead provides uniform temperature control by supplying heat transfer fluid to channels through a center portion of the showerhead to maintain a uniform and controlled temperature. The showerhead also supplies uniform precursor gas flow delivery to a chamber including the substrate. In some examples, the substrate processing system can be used to deposit conformal carbide films, although other types of film can be deposited.

Figure 1:
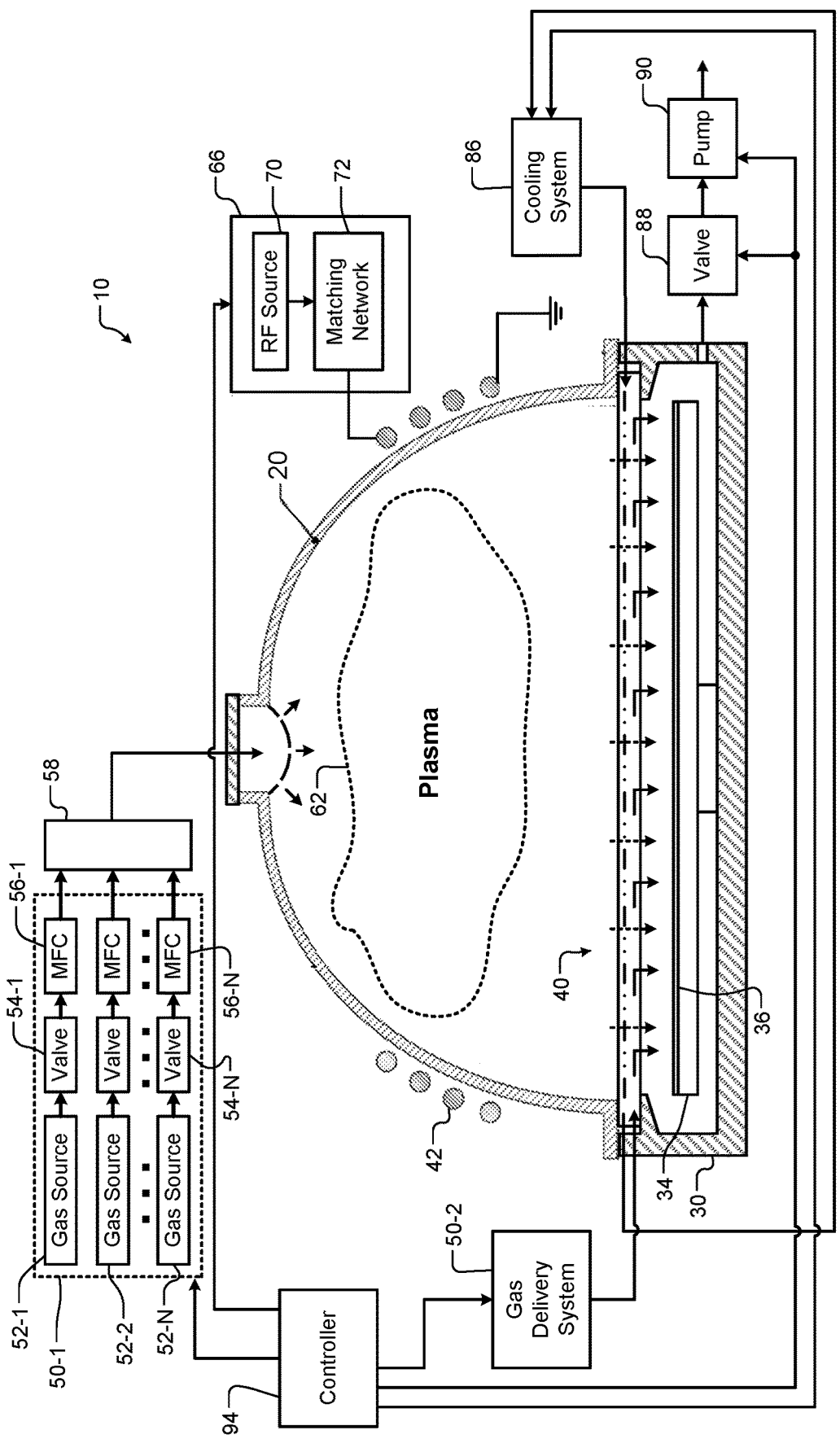
FIG. 1 is a functional block diagram of an example of a substrate processing chamber including a showerhead according to the present disclosure.

Referring now to FIG. 1, a substrate processing system 10 includes an upper chamber 20 and a lower chamber 30. While a specific type of substrate processing system is shown and described, other types may be used. While inductively coupled plasma is shown, other types of plasma generation may be used such as capacitively coupled plasma, remote plasma sources, or other suitable plasma generators.

In some examples, the upper chamber 20 may include a dome shaped chamber, although other chamber shapes can be used. A substrate support 34 is arranged in the lower chamber 30. A substrate 36 is arranged on the substrate support 34 during substrate treatment. A showerhead 40 is arranged between the upper chamber 20 and the lower chamber 30. Inductive coils 42 may be arranged around the upper chamber 20.

A gas delivery system 50-1 may be used to supply a process gas mixture including plasma gas to the upper chamber 20. The gas delivery system 50-1 includes one or more gas sources 52-1, 52-2, . . . , and 52-N, valves 54-1, . . . , and 54-N, mass flow controllers (MFC) 56-1, . . . , and 56-N, and a manifold 58, although other types of gas delivery systems can be used (where N is an integer). A gas delivery system 50-2 delivers a process gas mixture including precursor gas to the showerhead 40.

An RF plasma generator 66 includes an RF source 70 and a matching network 72. The RF plasma generator 66 selectively supplies RF power to the inductive coil 42 (while plasma gas is supplied) to generate plasma 62 in the upper chamber 20.

A thermal control system 86 may be used to supply heat transfer fluid such as gas or a liquid coolant to the showerhead 40 to control a temperature of the showerhead 40. A valve 88 and a pump 90 may be used to evacuate reactants.

A controller 94 communicates with the gas delivery systems 50-1 and 50-2 to selectively supply process gases as needed to the upper chamber 20 and the showerhead 40. The controller 94 communicates with the RF plasma generator 66 to generate and extinguish plasma in the upper chamber 20.

The controller 94 communicates with the thermal control system 86 to control a flow rate and temperature of heat transfer fluid that is used to control the temperature of the showerhead 40. In some examples, the heat transfer fluid may include water, water mixed with ethylene glycol, perfluoropolyether fluorinated fluid or other fluid and/or one or more gases. In some examples, the thermal control system 86 controls the flow rate or temperature of the heat transfer fluid using closed loop control. In other examples, the thermal control system 86 controls the flow rate and temperature using proportional integral derivative (PID) control. The heat transfer fluid may be provided in an open loop system from a building water circulation system. In some examples, the heat transfer fluid is hermetically sealed from the vacuum chamber.

In some examples, the controller 94 may be connected to one or more temperature sensors (not shown) arranged in the showerhead 40 to sense one or more temperatures of the showerhead 40. In some examples, the controller 94 may be connected to one or more pressure sensors (not shown) arranged in the showerhead 40 to sense one or more pressures in the processing chamber. The controller 94 communicates with the valve 88 and the pump 90 to control pressure within the upper and lower chambers 20, 30 and to selectively evacuate reactants therefrom.

Figure 2A:
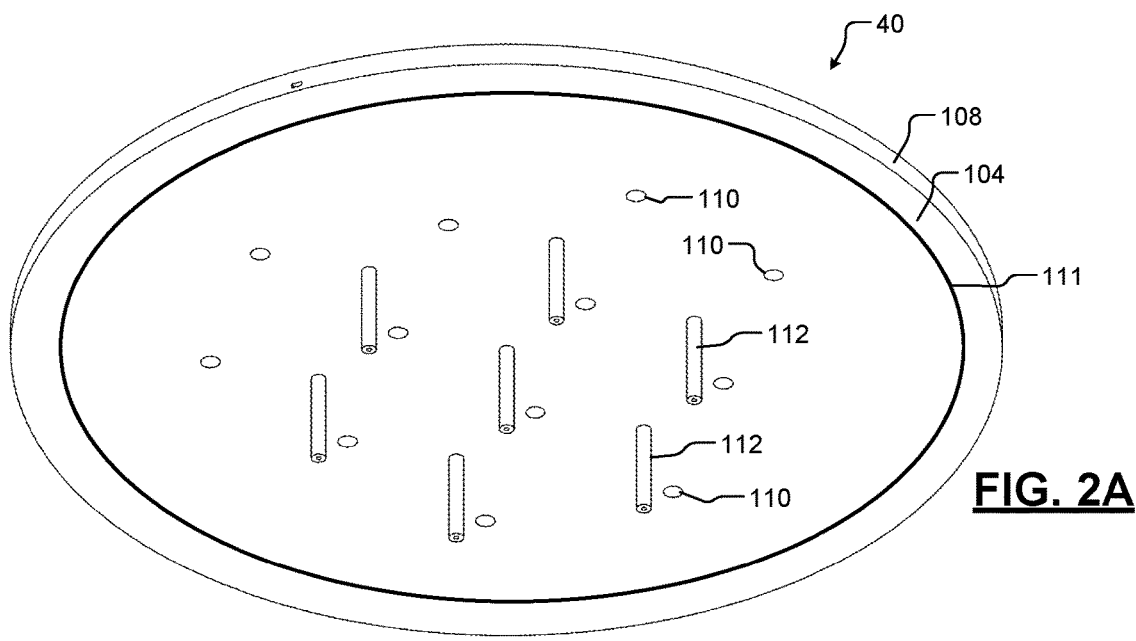
FIG. 2A is a bottom perspective view of an example of the showerhead according to the present disclosure.
Figure 2B:
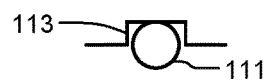
FIG. 2B is a side cross-sectional view illustrating a groove for receiving an O-ring according to the present disclosure.
Figure 3:
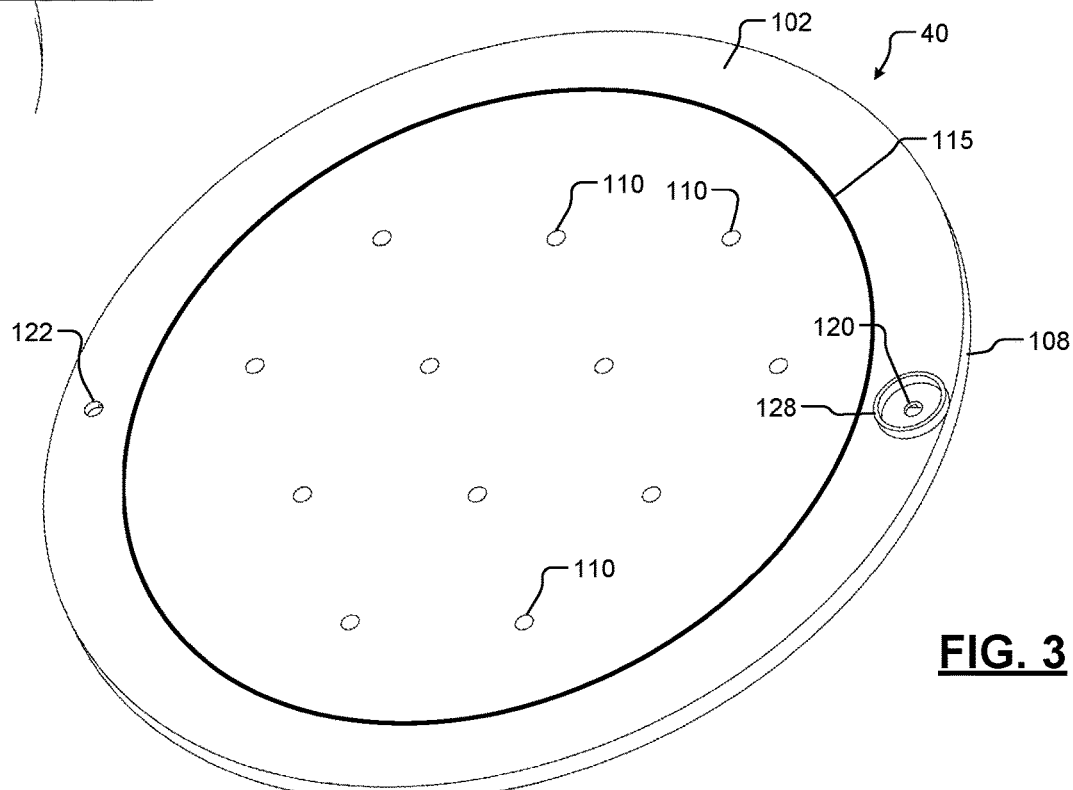
FIG. 3 is a top perspective view of an example of the showerhead according to the present disclosure.

Referring now to FIGS. 2A-3, a top surface 102, a bottom surface 104 and a side surface 108 of the showerhead 40 are shown. In FIG. 2A, the showerhead 40 includes a plurality of spaced through holes 110 that pass from the top surface 102 of the showerhead 40 to the bottom surface 104 of the showerhead 40 in an axially central portion or center of the showerhead. In some examples, an O-ring 111 may be located between the bottom surface 104 of the showerhead 40 and the lower chamber 30 as shown in FIG. 2B. A groove 113 may be located on one or both of the showerhead 40 and the lower chamber 30 to position the O-ring 111.

A plurality of secondary gas injectors 112 supply secondary gas such as precursor gas from the showerhead 40. In some examples, the secondary gas injectors 112 extend downwardly from the bottom surface 104 of the showerhead 40 in the center portion of the showerhead 40. In some examples, the secondary gas injectors 112 include a restriction (not shown) on the bottom surface 104 to prevent back-diffusion and to make gas flow uniform from one secondary gas injector to another. The restriction may induce choked flow conditions.

In FIG. 3, the showerhead 40 includes pairs of thermal fluid ports 120, 122 to act as an inlet and outlet. The showerhead 40 may contain more than one thermal fluid plenum with more pairs of ports. A leak collection tray 128 may be arranged around one or both of the thermal fluid ports 120, 122. The leak collection tray 128 may be arranged outside of the upper and lower chambers. The leak collection tray 128 allows leak detection. In some examples, an O-ring 115 may be located between the top surface 102 of the showerhead 40 and the upper chamber 20. A groove may be located on one or both of the showerhead 40 and the upper chamber 20 to position the O-ring 111 in a manner similar to that shown in FIG. 2B.

Figure 4A:
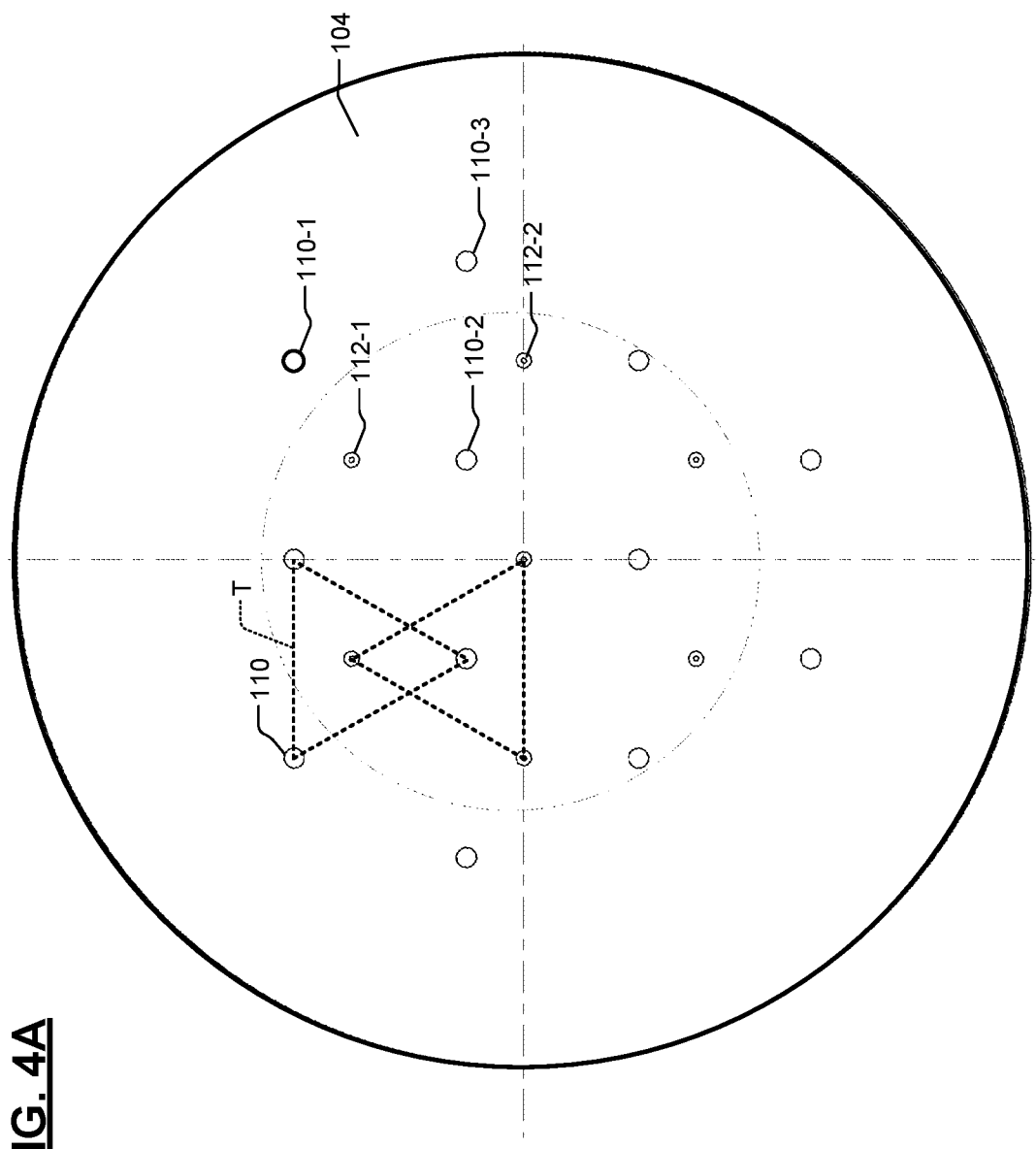
FIG. 4A is a plan view illustrating a bottom surface of an example of the showerhead according to the present disclosure.

Referring now to FIG. 4A, the through holes 110 and the secondary gas injectors 112 of the showerhead 40 may be arranged in various patterns. For example, the through holes 110 and the secondary gas injectors 112 of the showerhead 40 shown in FIG. 4A may have an offset triangular pattern T. Alternate patterns include rectangular, radial, hexagonal or spiral patterns, although other patterns can be used. In some examples, spacing of the secondary gas injectors 112 is in a range from 0.25" to 2". In some examples, the through holes 110 may have the same spacing as the secondary gas injectors, although different spacing may be used as shown in FIGS. 4B and 4C.

Figure 4B:
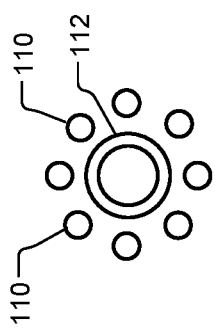
FIG. 4B is a plan view illustrating an example of a plurality of through holes arranged around a secondary gas injector according to the present disclosure.
Figure 4C:
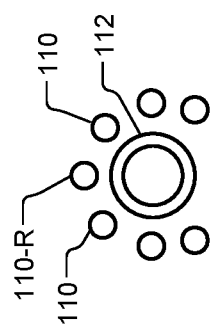
FIG. 4C is a plan view illustrating another example of a plurality of through holes arranged around a secondary gas injector according to the present disclosure.

In some examples, the through holes 110 may include a plurality of smaller through holes that are clustered around each secondary gas injector 112 as shown in the examples in FIGS. 4B and 4C. The arrangement of the through holes 110 around the secondary gas injectors 112 can be uniform as shown in FIG. 4B or non-uniform as shown in FIG. 4C. In some examples, a through hole 110-R is located on a radial line of the showerhead 40 on a side of the secondary gas injector closes to a center of the showerhead 40.

Figure 5A:
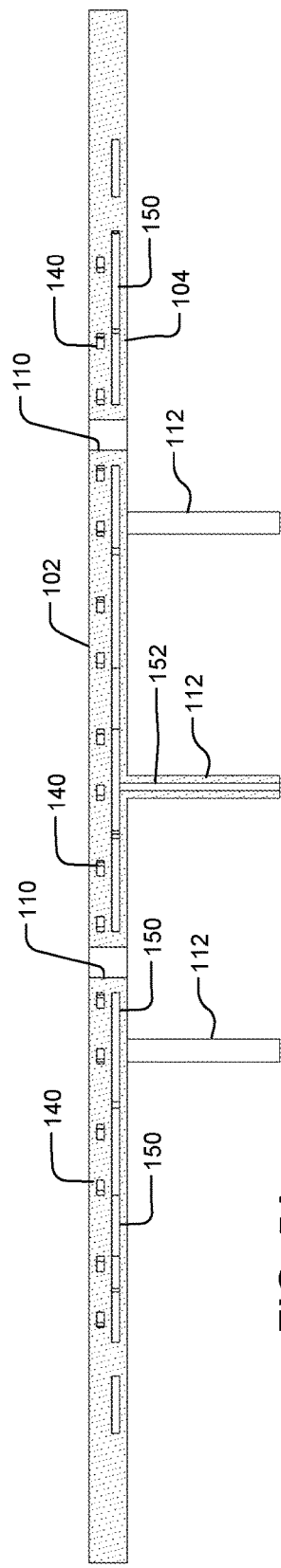
FIG. 5A is a side cross-sectional view of an example of the showerhead according to the present disclosure.

Referring now to FIGS. 5A-8B, side cross-sectional views of the showerhead 40 are shown. In FIG. 5A, the through holes 110 pass from the top surface 102 of the showerhead 40 to the bottom surface 104 thereof. One or more heat transfer fluid plenums 140 are located in one or more planes that are perpendicular to the through holes 110 and parallel but offset from the top surface 102 of the showerhead 40. One or more secondary gas plenums 150 are located in one or more planes that are perpendicular to the through holes 110 and parallel but offset from the bottom surface 104 of the showerhead 40 and the one or more planes including the heat transfer fluid plenums 140. The configuration shown is the heat transfer fluid plenum above the secondary gas plenum. The plenums may be reversed so that the secondary gas plenum is above the heat transfer fluid plenum.

The one or more heat transfer fluid plenums 140 are connected to thermal fluid ports 120, 122. The one or more secondary gas plenums 150 receive gas from the secondary gas inlet (FIG. 2A) and supply the secondary gas flow to flow channels 152 of the secondary gas injectors 112.

In some examples, the secondary gas injectors 112 extend a predetermined distance away from a bottom surface of the showerhead 40 to reduce deposition of film on the showerhead 40. In some examples, the predetermined distance is in a range from 0.1" to 1.5", although other distances can be used. In some examples, the secondary gas injectors 112 include a restriction to prevent back diffusion and ensure flow uniformity from one secondary gas injector to another. In some examples, the through holes 110 have a diameter in a range from 0.05" to 0.3".

Figure 5B:
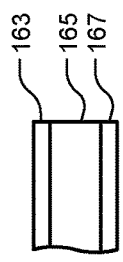
FIG. 5B is a side cross-sectional view of an example showing a showerhead formed by multiple adjacent layers.

In FIG. 5B, the showerhead 40 can be made of multiple layers including a top layer 163, a middle layer 165 and a bottom layer 167 that are connected together. More layers may be added to create additional plenums. In some examples, the showerhead 40 can be manufactured using vacuum brazing, tungsten inert gas (TIG) welding, or electron beam welding to enable complex and unique geometries at a reasonable cost. Vacuum braze joining allows the showerhead to be machined as flat plates with grooves cut into the plates with a layer of braze between each plate. Welding techniques require more complex sub-components for the weld to access all areas which require sealing. Posts and corresponding holes may be machined to raise the sealing area to the surface of the part where it is accessible to weld.

In some examples, a top surface of the middle layer 165 defines the one or more heat transfer fluid plenums 140 and a bottom surface of the middle layer 165 defines the one or more secondary gas plenums 150. However, a bottom surface of the top layer 163 can be used to partially or fully define the one or more heat transfer fluid plenums 140 and the top surface of the bottom layer 167 can be used to fully or partially define the one or more secondary gas plenums.

In some examples, the thickness of the plenums and material above and below them is 0.05" to 0.25", although other thicknesses can be used. The thickness of the material in-between and above/below the plenums is determined by the strength needed to support the fluid pressure and material thickness required for manufacturing. A thickness of the heat transfer fluid plenum 140 may be sized to reduce a pressure drop of the fluid. A size of the secondary gas plenum 150 may be selected large enough to allow uniform distribution of gas to each injector 112. The thickness of each layer should be minimized to reduce the overall thickness to reduce loss of radicals in the through holes 110.

In some examples, the thickness of the top layer 163 and the bottom layer 167 is in a range from 0.075" to 0.125", although other thicknesses can be used. In some examples, the thickness of the top layer 163 and the bottom layer 167 is 0.1", although other thicknesses can be used. In some examples, the thickness of the middle layer 165 is in a range from 0.4" to 0.6", although other thicknesses can be used. In some examples, the thickness of the middle layer 165 is 0.5", although other thicknesses can be used. In some examples, the thickness of the showerhead is less than or equal to 1". In some examples, the thickness of the showerhead is less than or equal to 0.7".

Figure 6:
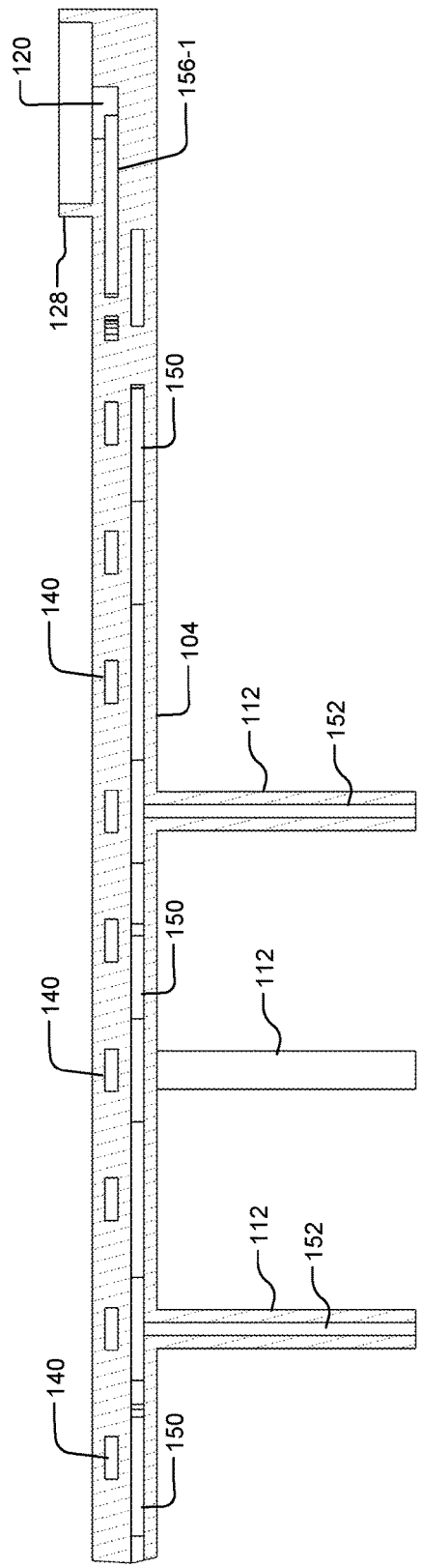
FIG. 6 is an enlarged side cross-sectional view of another example of the showerhead according to the present disclosure.
Figure 7:
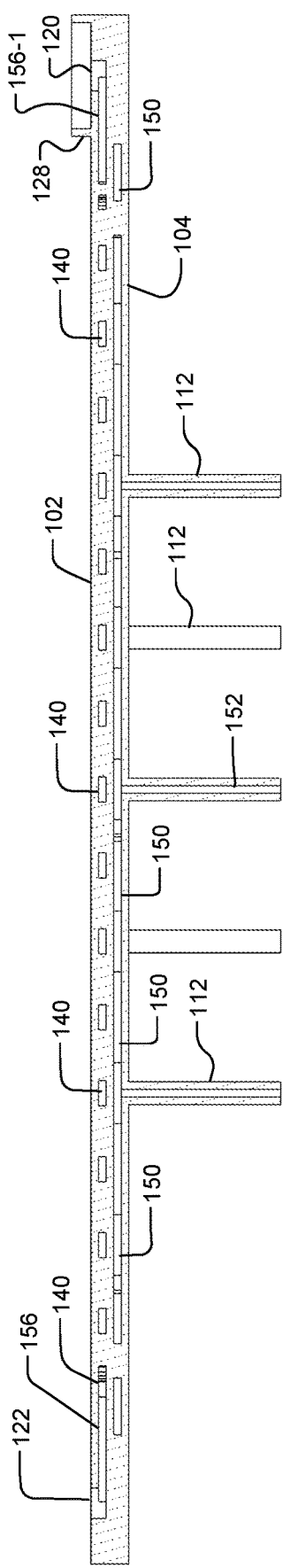
FIG. 7 is a side cross-sectional view of the showerhead of FIG. 6 according to the present disclosure.

In FIGS. 6 and 7, the leak collection tray 128 is shown. The leak collection tray 128 includes a recess that is arranged around at least one of the thermal fluid ports 120, 122. In some examples, the recess is cylinder-shaped, although other shapes can be used.

Figure 8A:
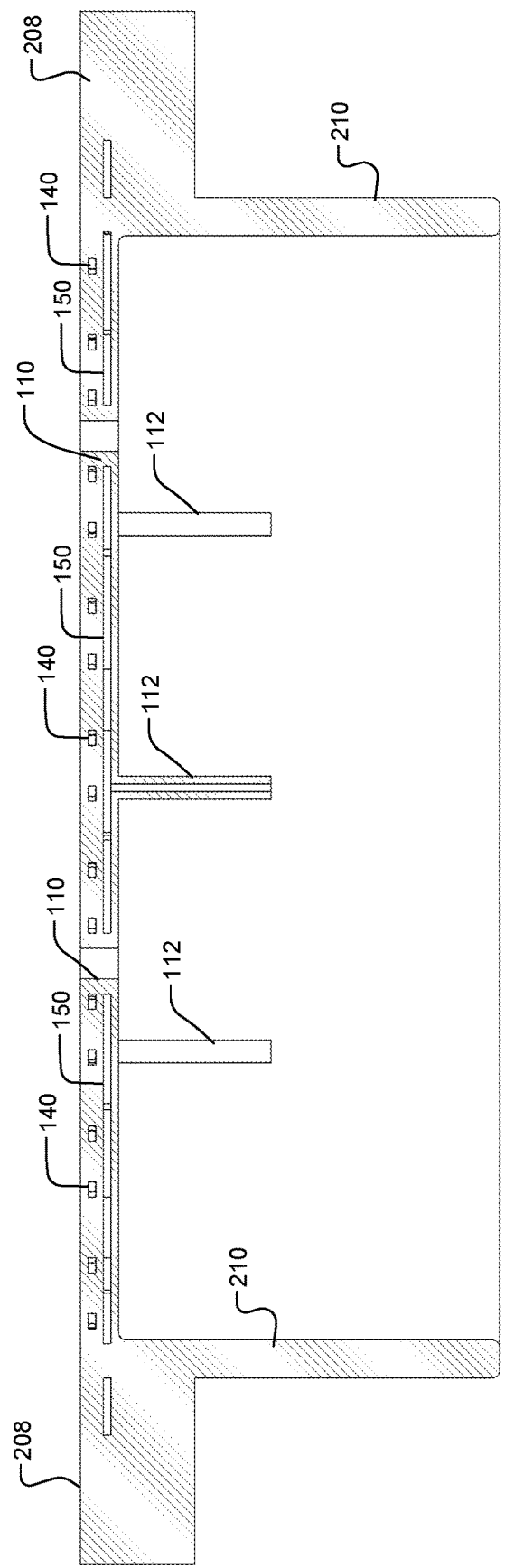
FIG. 8A is an enlarged side cross-sectional view of another example of the showerhead including a downwardly-projecting wall according to the present disclosure.

In FIG. 8A, some examples include a cylindrical wall 210 that extends downwardly (near or spaced radially inwardly) from a radially outer edge 208 of the showerhead 40 towards the substrate 36 (and radially outside of the through holes 110 and the secondary gas injectors 112). The cylindrical wall 210 may be integrated with or attached to the showerhead 40. The cylindrical wall 210 improves thermal uniformity between the showerhead 40 and the chamber wall seen by the substrate. The cylindrical wall 210 may also be used to control exhaust port pumping non-uniformity by creating a flow restriction between the wall and the substrate support 34. In some examples, the cylindrical wall 210 extends below a plane including a top surface of the substrate support 34.

Figure 8B:
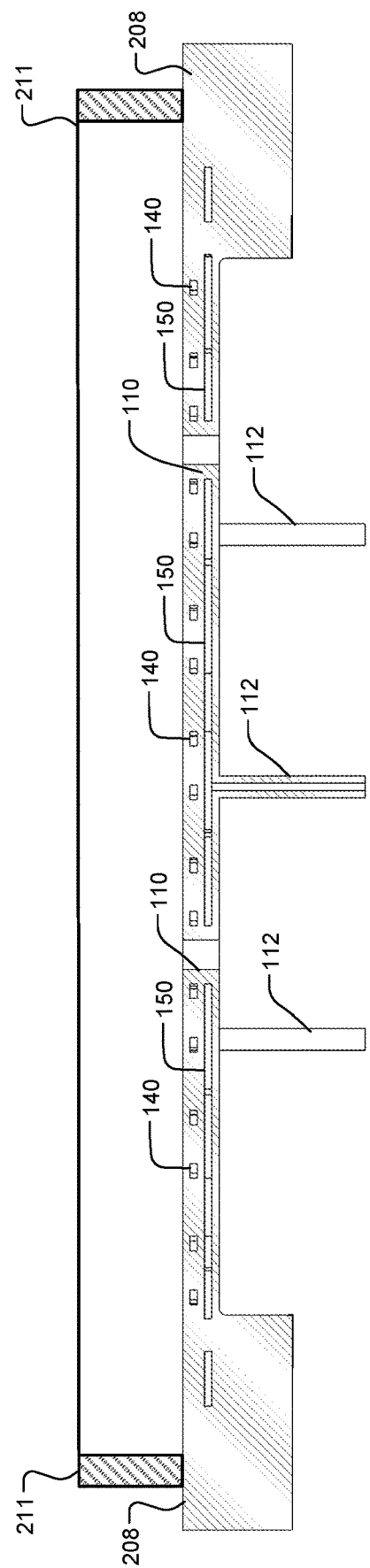
FIG. 8B is an enlarged side cross-sectional view of another example of the showerhead including an upwardly-projecting wall according to the present disclosure.

In FIG. 8B, some examples include a cylindrical wall 211 that extends upwardly (near or spaced radially inwardly) from a radially outer edge 208 of the showerhead 40 (and radially outside of the through holes 110 and the secondary gas injectors 112). The cylindrical wall 211 may be integrated with or attached to the top surface of showerhead 40. The cylindrical wall 211 provides a mounting surface for mounting a radical source.

Figure 9:
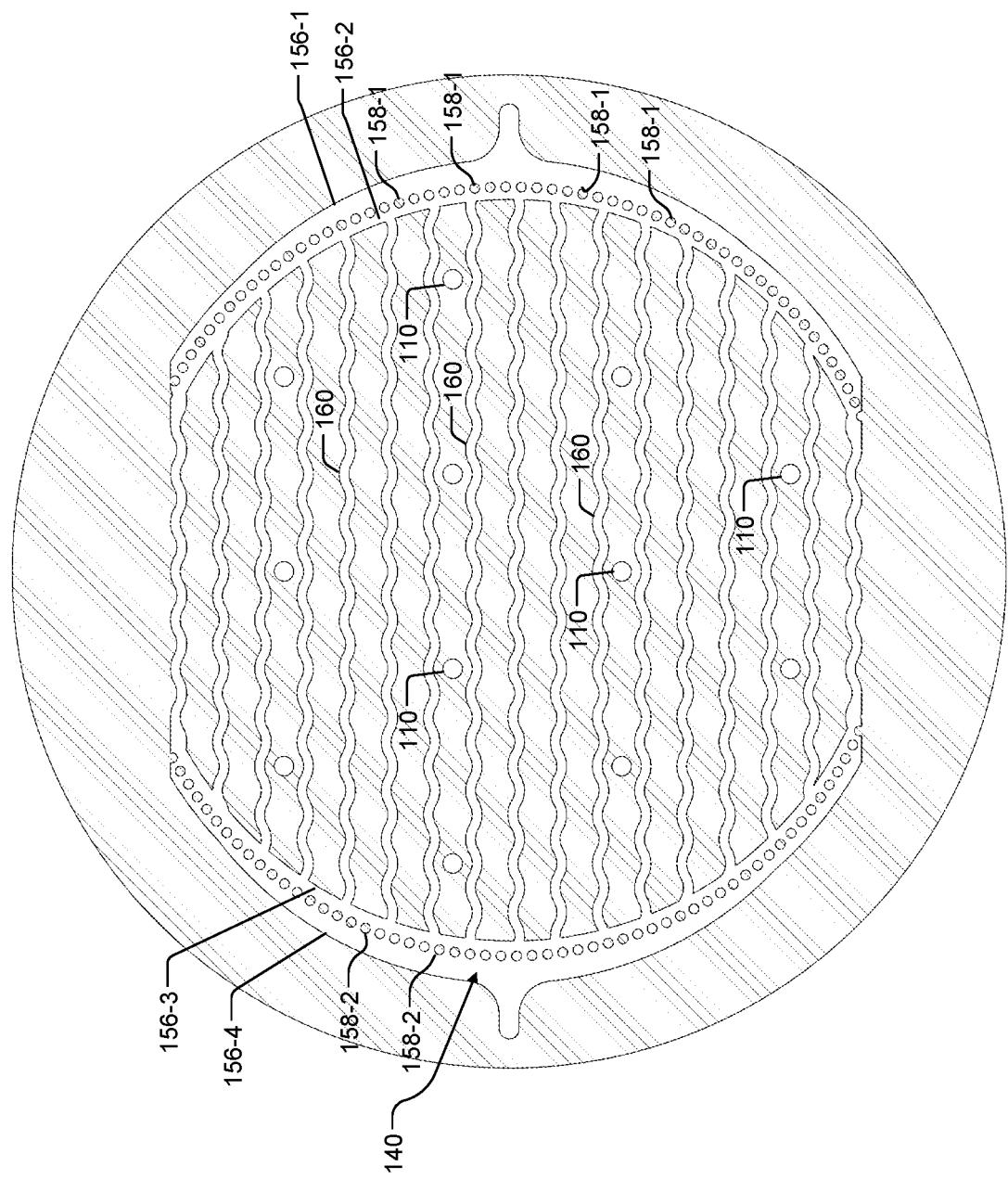
FIG. 9 is a plan view of an example of a top surface of a middle layer of the showerhead according to the present disclosure.
Figure 10:
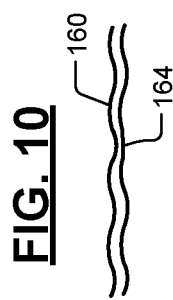
FIG. 10 illustrates an example of a channel with a restriction to control flow of fluid through the channel according to the present disclosure.

Referring now to FIG. 9-10, an example arrangement of the one or more heat transfer fluid plenums 140. In FIG. 9, the top surface of the middle layer 165 is shown. The one or more heat transfer fluid plenums 140 include a first plenum 156-1. In some examples, the first plenum 156-1 has an arcuate shape, although other shapes can be used. In some examples, a plurality of restrictions 158-1 is arranged adjacent to one another on one side of the first plenum 156-1. Spacing between each of the plurality of restrictions 158-1 is selected to restrict and distribute flow from the first plenum 156-1 into a second plenum 156-2. In some examples, each the plurality of restrictions 158-1 includes a post having a round, elliptical or oblong shape, although other shapes can be used. The plurality of restrictions 158-1 may be used to make fluid flow between the flow channels 160 more uniform and to eliminate jetting effects. Alternately, one or more of the flow channels 160 can include a restriction 164 to control flow as shown in FIG. 10. If the flow channels 160 include the restriction 164, the plurality of restrictions 158-1 can be omitted and the first and second plenums 156-1 and 156-2 can be a single plenum.

The second plenum 156-2 opens into first ends of flow channels 160. In some examples, the flow channels 160 have a triangular, square-wave, curved or generally sinusoidal shape to increase surface area. Second ends of the flow channels 160 are connected to a third plenum 156-3 arranged at an opposite side of the showerhead 40. A plurality of restrictions 158-2 is arranged on one side of the third plenum 156-3. Each of the plurality of restrictions 158-2 is arranged to restrict flow into a fourth plenum 156-4. The fourth plenum 156-4 is connected to an outlet. If the flow channels 160 include the restriction 164, the plurality of restrictions 158-2 can be omitted and the third and fourth plenums 156-3 and 156-4 can be a single plenum.

In some examples, the thermal fluid flow channels 160 have a channel to channel non-uniformity of less than or equal to 10% flow rate. In some examples, the thermal fluid flow rate is 10 gallons per minute and controls the entire showerhead surface to +−1 degree Celsius. In some examples, the secondary gas injectors 112 have flow non-uniformity less than or equal to 1% mass flow rate. In some examples, the secondary gas injectors 112 have non-uniformity less than or equal to 0.1% mass flow rate.

Figure 11:
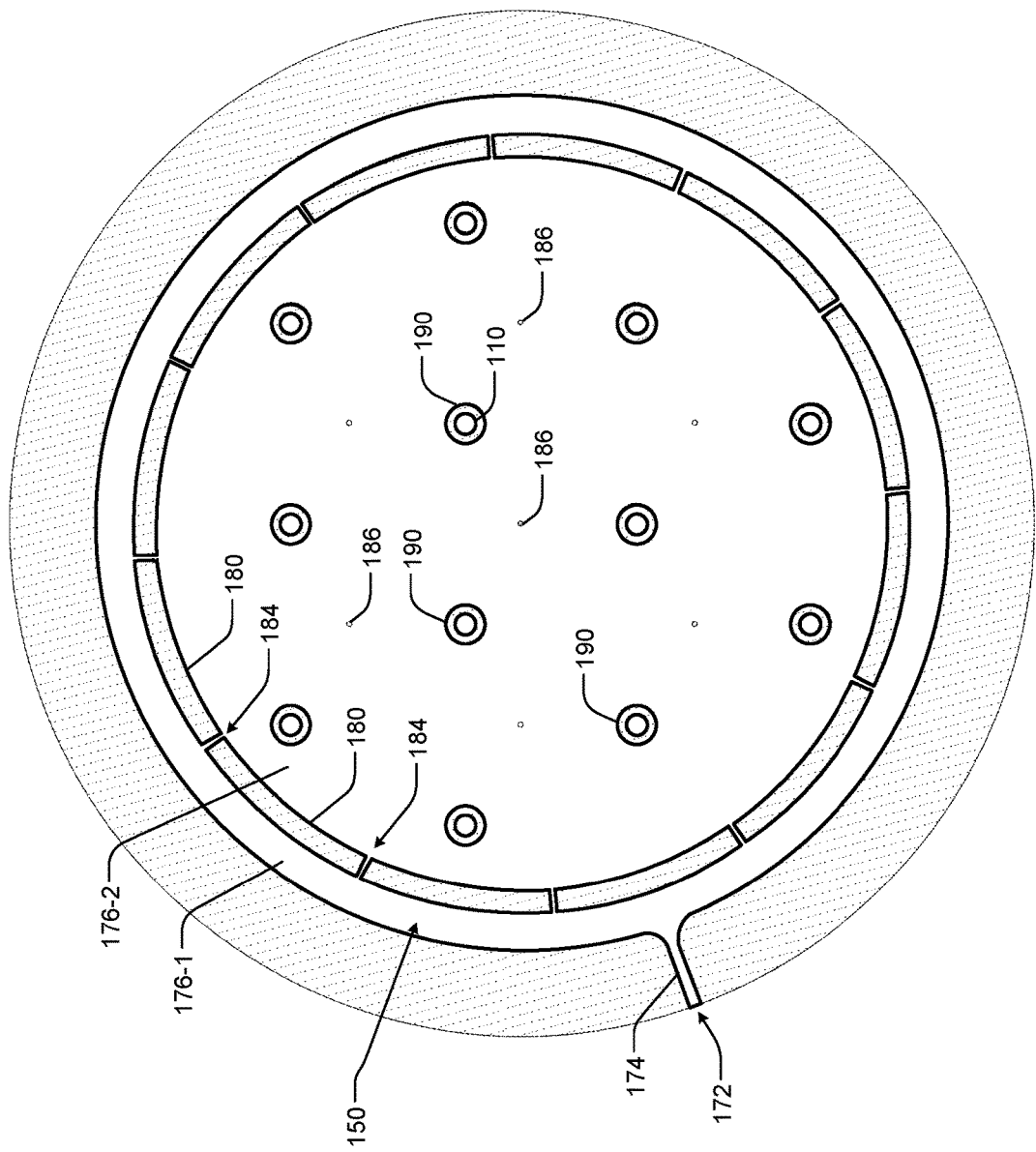
FIG. 11 is a plan view of an example of a bottom surface of the middle layer of the showerhead according to the present disclosure.

In FIG. 11, the bottom surface of the middle layer 165 is shown. The one or more secondary gas plenums 150 include a gas inlet 172 and a flow passage 174 in fluid communication with a first plenum 176-1 and a second plenum 176-2. A first plurality of walls 180 are arranged between the first plenum 176-1 and the second plenum 176-2. A plurality of slots 184 is arranged between ends of the plurality of walls 180 to restrict flow between the first plenum 176-1 and the second plenum 176-2. In some examples, the first plenum 176-1 is ring-shaped, the second plenum 176-2 is circular and the first plurality of walls 180 is arcuate-shaped, although other shapes can be used.

A second plurality of walls 190 is arranged around the through holes 110. In some examples, the second plurality of walls 190 has a cylindrical shape, although other shapes can be used. In some examples, a top edge of the second plurality of walls 190 provides a bonding area to create a vacuum seal between the second plenum 176-2 and the through holes 110. In some examples, a plurality of restrictions 186 is provided at inlets of the secondary gas injectors 112 to control flow of the secondary gas from the second plenum 176-2 to the lower chamber 30.

In some examples, the slots 184 are sized relative to the restrictions 186 such that the pressure drop $\Delta P_{slots}$ at the slots 184 is significantly greater than the pressure drop $\Delta P_{first\ plenum}$. In some examples, $\Delta P_{slots}$ is 20 times greater than $\Delta P_{first\ plenum}$. In some examples, $\Delta P_{slots}$ is 5 times greater than $\Delta P_{first\ plenum}$.

Figure 12:
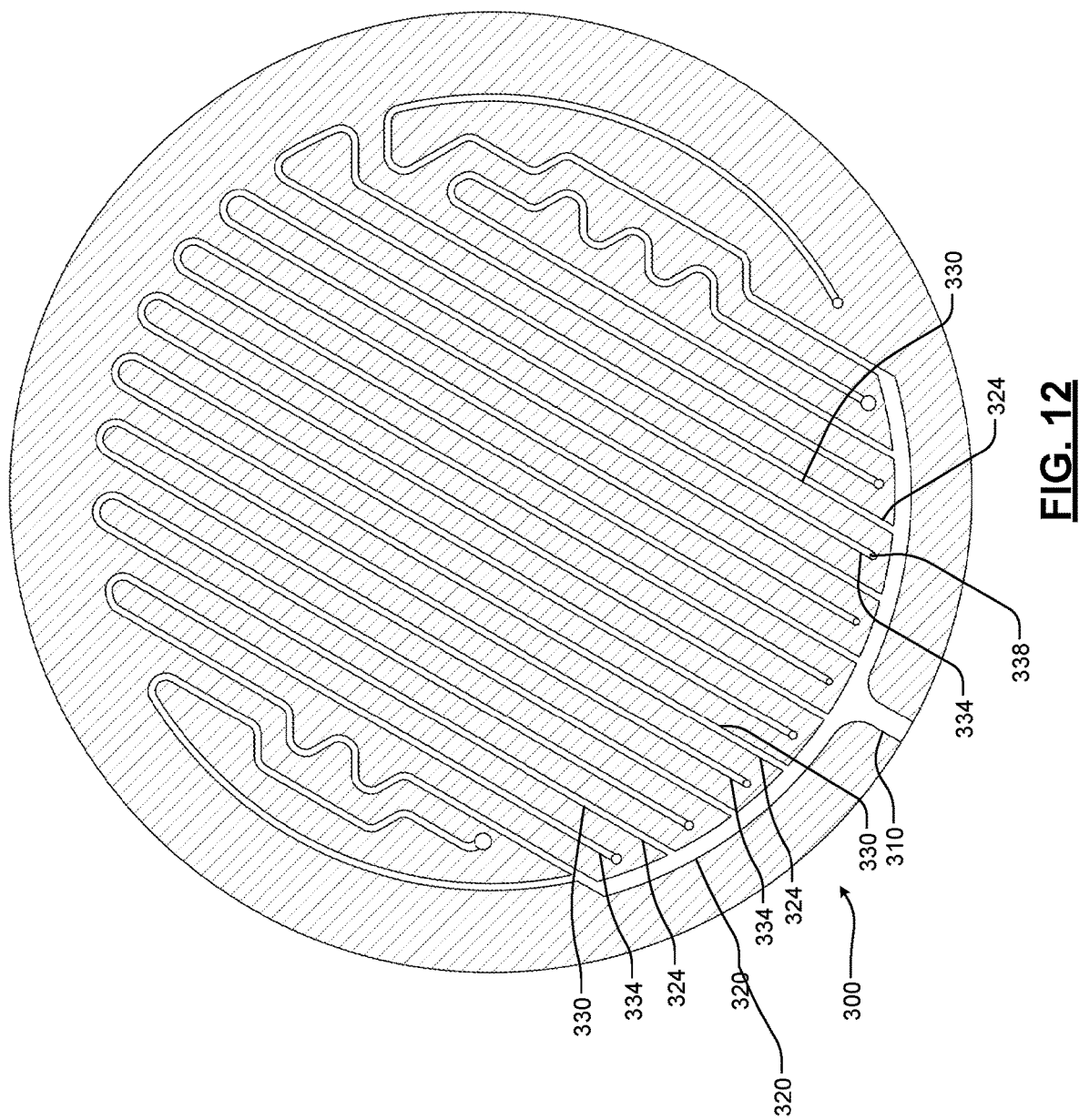
FIG. 12 is a plan view of another example of a top surface of the middle layer of the showerhead including alternating heat transfer fluid inlet and outlet pairs arranged along one edge thereof according to the present disclosure.
Figure 14:
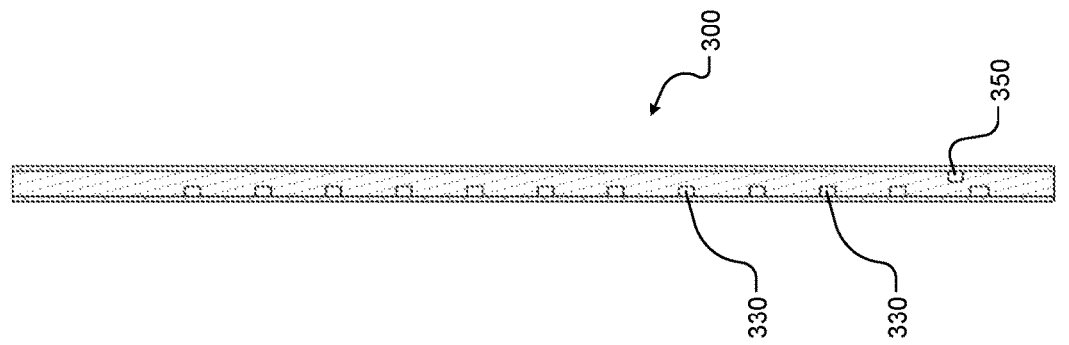
FIG. 14 is a side cross-sectional view of the showerhead in FIGS. 12 and 13.
Figure 13:
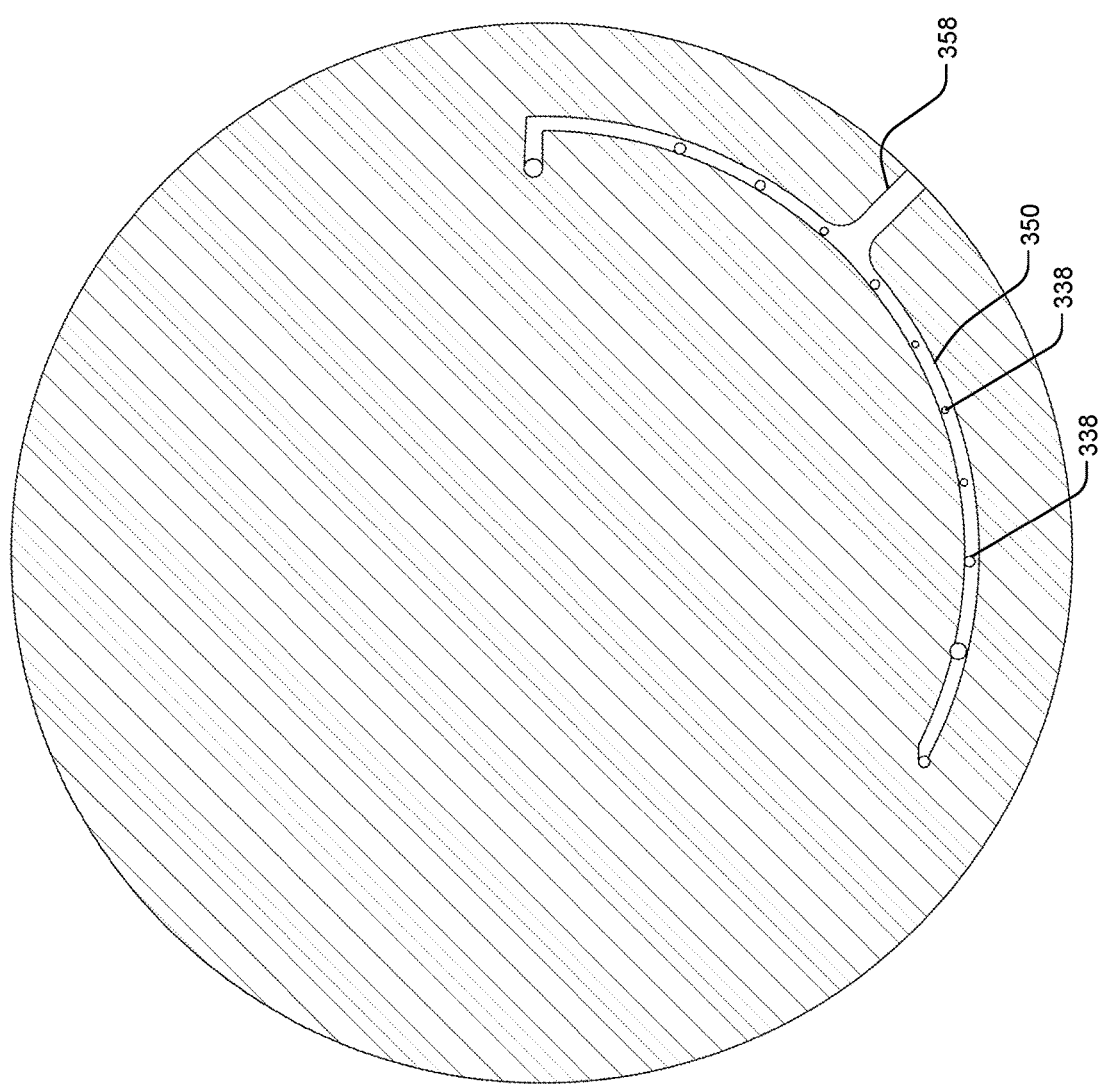
FIG. 13 is a plan view of a bottom surface of the middle layer of the showerhead in FIG. 12 according to the present disclosure.

Referring now to FIGS. 12-14, a middle portion 300 of another showerhead 40 is shown to include heat transfer fluid inlets and outlets arranged along one side thereof. In other words, the flow channels travel from the inlets across the showerhead and return back across the showerhead to the outlets.

In FIG. 12, a top side of the middle portion 300 is shown. A fluid inlet 310 is connected to fluid inlet plenum 320. In some examples, the fluid inlet plenum 320 is arcuate-shaped. Inlets 324 to a plurality of flow channels 330 are connected to the fluid inlet plenum 320. The plurality of flow channels 330 traverse across the showerhead 40, turn and return back to outlets 334 that are located between adjacent ones of the inlets 324. While the flow channels 330 are shown as straight segments, non-straight flow channels such as those shown above can be used to increase surface area and heat transfer (or a combination of straight and curved can be used).

The outlets 334 pass through gas vias 338 in the middle portion 300 to an outlet plenum 350 located on a bottom side of the middle portion 300 in FIG. 13. The outlet plenum 350 is connected to a fluid outlet 358. As can be appreciated, the bottom surface of the middle portion 300 may also include a secondary gas plenum similar to that shown above in FIG. 11. The size of the vias 338 may be varied to compensate for non-uniform flow rate from channel to channel to achieve the same uniformity as using restrictions 158-1 or restrictions 158-2.

The integrated showerheads described herein deliver sufficient and uniform radicals, filter ions from a remote plasma source, provide uniform temperature control, and supply uniform precursor. In some examples, thermal control provided by the showerheads including the heat transfer fluid channels described above control thermal non-uniformity across the substrate to less than 5° C. The heat transfer fluid channels are also capable of controlling the heat generated from the plasma contained in the volume of the upper chamber 20. The showerhead further includes an internal secondary gas plenum that provides uniform precursor delivery to the lower chamber. In some examples, gas outlets from the secondary gas plenum are offset by a predetermined distance from a bottom surface of the showerhead to minimize deposition on the showerhead and extend time between cleans.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a substrate pedestal, a gas flow system, etc.). These systems may be integrated with electronics for controlling their operation before, during, and after processing of a semiconductor substrate or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, substrate transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor substrate or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a substrate.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the substrate processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor substrates.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of substrates to and from tool locations and/or load ports in a semiconductor manufacturing factory.

What is claimed is:

1. A substrate processing system, comprising:
   a first chamber including a substrate support;
   a showerhead arranged above the first chamber and configured to filter ions and deliver radicals from a plasma source to the first chamber,
   wherein the showerhead includes:
      a top layer;
      a bottom layer;
      a middle layer having a first surface that directly contacts the top layer and a second surface that directly contacts the bottom layer;
      a heat transfer fluid plenum configured to control a temperature of the showerhead and including:
         a first plenum disposed between the top layer and the bottom layer and configured to receive heat transfer fluid from a heat transfer fluid inlet,
         a second plenum disposed between the top layer and the bottom layer and configured to output the heat transfer fluid to a heat transfer fluid outlet, and
         flow channels that are formed between the top layer and the bottom layer and that form fluidic connections between the first plenum and the second plenum;
      a secondary gas plenum including a secondary gas inlet configured to receive secondary gas and secondary gas injectors configured to inject the secondary gas into the first chamber;
      through-holes that are not in fluidic communication with the heat transfer fluid plenum or the secondary gas plenum within the showerhead; and
      a cylindrical wall with an inner surface and an outer surface, wherein:
         the cylindrical wall extends from a showerhead bottom surface,
         the inner surface of the cylindrical wall is located radially outside of the plurality of through holes and the plurality of secondary gas injectors, and
         the outer surface of the cylindrical wall is located radially inward from an outer edge of the showerhead.

2. The substrate processing system of claim 1 wherein the flow channels each include non-straight segments.

3. The substrate processing system of claim 1 wherein the flow channels each include both straight segments and non-straight segments.

4. The substrate processing system of claim 1 wherein outlets of the flow channels are located between adjacent ones of inlets of the flow channels.

5. The substrate processing system of claim 1, wherein the first plenum is arcuate.

6. The substrate processing system of claim 1, wherein the second plenum is arcuate.

7. The substrate processing system of claim 1, wherein the heat transfer fluid inlet is formed between the top layer and the bottom layer.

8. The substrate processing system of claim 7, wherein the heat transfer fluid outlet is formed between the top layer and the bottom layer.

9. The substrate processing system of claim 1, wherein the secondary gas plenum includes:
   a first gas plenum;
   a second gas plenum; and
   a flow restriction arranged between the first gas plenum and the second gas plenum.

10. The substrate processing system of claim 1, wherein the heat transfer fluid plenum is configured to not flow the heat transfer fluid into the first chamber.

11. The substrate processing system of claim 1, wherein the showerhead includes a cylindrical wall that extends downwardly from a bottom surface thereof and that is located radially outside of the through-holes and the secondary gas injectors.

12. The substrate processing system of claim 1, wherein the showerhead includes a cylindrical wall that extends upwardly from a top surface thereof and that is located radially outside of the through-holes and the secondary gas injectors.

13. A showerhead for a substrate processing chamber, the showerhead comprising:
   a top layer;
   a bottom layer;
   a middle layer having a first surface that directly contacts the top layer and a second surface that directly contacts the bottom layer;
   a heat transfer fluid plenum including:
      a first plenum formed between the top layer and the bottom layer and configured to receive heat transfer fluid from a heat transfer fluid inlet;
      a second plenum formed between the top layer and the bottom layer and configured to output the heat transfer fluid to a heat transfer fluid outlet; and
      flow channels that are formed between the top layer and the bottom layer and that connect the first plenum with the second plenum such that the first plenum is in fluidic communication with the second plenum;
   a secondary gas plenum including a secondary gas inlet configured to receive secondary gas and secondary gas injectors configured to inject the secondary gas;

through-holes that are not in fluid communication with the heat transfer fluid plenum or the secondary gas plenum within the showerhead; and a cylindrical wall with an inner surface and an outer surface, wherein:
the cylindrical wall extends from a showerhead bottom surface,
the inner surface of the cylindrical wall is located radially outside of the plurality of through holes and the plurality of secondary gas injectors, and
the outer surface of the cylindrical wall is located radially inward from an outer edge of the showerhead.

14. The showerhead of claim 13, wherein the showerhead includes a cylindrical wall that extends downwardly from a bottom surface thereof and that is located radially outside of the through-holes and the secondary gas injectors.

15. The showerhead of claim 13, wherein the showerhead includes a cylindrical wall that extends upwardly from a top surface thereof and that is located radially outside of the through-holes and the secondary gas injectors.

16. The showerhead of claim 13, wherein:
the heat transfer fluid inlet is formed between the top layer and the bottom layer; and
the heat transfer fluid outlet is formed between the top layer and the bottom layer.

17. A showerhead for a substrate processing chamber, the showerhead comprising:
a top layer;
a bottom layer;
a middle layer having a first surface that directly contacts the top layer and a second surface that directly contacts the bottom layer;
a heat transfer fluid plenum including:
a first plenum formed between the top layer and the bottom layer and configured to receive heat transfer fluid from a heat transfer fluid inlet;
a second plenum formed between the top layer and the bottom layer and configured to output the heat transfer fluid to a heat transfer fluid outlet; and
flow channels that are formed between the top layer and the bottom layer and that connect the first plenum with the second plenum such that the first plenum is in fluidic communication with the second plenum;
a secondary gas plenum including a secondary gas inlet configured to receive secondary gas and secondary gas injectors configured to inject the secondary gas; and
a cylindrical wall with an inner surface and an outer surface, wherein:
the cylindrical wall extends from a showerhead bottom surface,
the inner surface of the cylindrical wall is located radially outside of the plurality of through holes and the plurality of secondary gas injectors, and
the outer surface of the cylindrical wall is located radially inward from an outer edge of the showerhead.

18. The showerhead of claim 17, wherein the showerhead includes a cylindrical wall that extends downwardly from a bottom surface thereof and that is located radially outside of the secondary gas injectors.

19. The showerhead of claim 17, wherein the showerhead includes a cylindrical wall that extends upwardly from a top surface thereof and that is located radially outside of the secondary gas injectors.

20. The showerhead of claim 17, wherein the heat transfer fluid plenum further includes:
the heat transfer fluid inlet is formed between the top layer and the bottom layer; and
the heat transfer fluid outlet is formed between the top layer and the bottom layer.

\* \* \* \* \*